US011727973B2

(12) United States Patent
Noh et al.

(10) Patent No.: US 11,727,973 B2
(45) Date of Patent: Aug. 15, 2023

(54) MAGNETIC PROPERTY MEASURING SYSTEMS, METHODS FOR MEASURING MAGNETIC PROPERTIES, AND METHODS FOR MANUFACTURING MAGNETIC MEMORY DEVICES USING THE SAME

(71) Applicant: Samsung Electronics Co., Ltd., Suwon-si (KR)

(72) Inventors: Eunsun Noh, Yongin-si (KR); Juhyun Kim, Yongin-si (KR); Ung Hwan Pi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 17/316,973

(22) Filed: May 11, 2021

(65) Prior Publication Data

US 2021/0264957 A1    Aug. 26, 2021

Related U.S. Application Data

(62) Division of application No. 15/933,659, filed on Mar. 23, 2018, now Pat. No. 11,037,611.

(51) Int. Cl.
*G11C 11/16* (2006.01)
*G01R 33/09* (2006.01)
(Continued)

(52) U.S. Cl.
CPC .......... *G11C 11/161* (2013.01); *G01R 33/093* (2013.01); *H10N 50/01* (2023.02); *H10N 50/85* (2023.02)

(58) Field of Classification Search
CPC ....... H01L 43/12; H01L 43/10; G11C 11/161; G11C 13/04; G11C 11/1673; G01R 33/093; G01R 33/0325; H10N 50/85; H10N 50/01
(Continued)

(56) References Cited

U.S. PATENT DOCUMENTS 5,994,898 A    11/1999   DiMarzio et al.
6,407,545 B1   6/2002    Sato et al.
(Continued)

FOREIGN PATENT DOCUMENTS

JP    4252150 B2    4/2009
JP    5914903 B2    5/2016

OTHER PUBLICATIONS

Extended European Search Report dated Aug. 19, 2019 for corresponding European Application No. 19164403.8.
(Continued)

*Primary Examiner* — Lee E Rodak
*Assistant Examiner* — Trung Q Nguyen
(74) *Attorney, Agent, or Firm* — Harness, Dickey & Pierce, P.L.C.

(57) ABSTRACT

A magnetic property measuring system includes coil structures configured to apply a magnetic field to a sample, a light source configured to irradiate incident light to the sample, and a detector configured to detect polarization of light reflected from the sample. The magnetic field is perpendicular to a surface of the sample. Each coil structure includes a
(Continued)

pole piece and a coil surrounding an outer circumferential surface of the pole piece. A wavelength of the incident light is equal to or less than about 580 nm.

6 Claims, 10 Drawing Sheets

(51) Int. Cl.
*H10N 50/01* (2023.01)
*H10N 50/85* (2023.01)

(58) Field of Classification Search
USPC ........ 324/600, 676–683, 691–693, 702–710, 324/76.11, 76.77, 323, 360, 120, 355, 324/200, 252
See application file for complete search history.

(56) References Cited

U.S. PATENT DOCUMENTS

| | | |
|---|---|---|
| 6,501,269 B1 | 12/2002 | Vajda |
| 7,166,997 B2 | 1/2007 | Ju et al. |
| 8,264,693 B2 | 9/2012 | Stoica et al. |
| 8,283,622 B2 | 10/2012 | An et al. |
| 9,348,000 B1* | 5/2016 | Pressesky .......... G01R 33/0325 |
| 2011/0204459 A1 | 8/2011 | Gaidis |
| 2015/0325278 A1 | 11/2015 | Bauer et al. |
| 2017/0034456 A1* | 2/2017 | Kyung ............. H01L 27/14649 |
| 2018/0212140 A1 | 7/2018 | Noh |

OTHER PUBLICATIONS

Uwe Bauer, "Voltage Programmable Materials", Feb. 1, 2015, retrieved from the Internet: URL: https://dspace.mit.edu/bitstream/handle/1721.1/98317/919007175-MIT.pdf?sequence-1 [retrieved on Aug. 5, 2019].

Luong Chi Hieu et al., "Magneto-optical Kerr Spectroscopy and Interfacial Perpendicular Magnetic Anistropy of (Hf,Pt)/CoFeB/MgO Thin Films", Journal of the Korean Physical Society, vol. 67, No. 7, Oct. 17, 2015, pp. 1235-1239.

M. Cormier et al., "High resolution polar Kerr magnetometer for nanomagnetism and nanospintronics", Review of Scientific Instruments. vol. 79, No. 3, 033706, Mar. 13, 2008.

Funabashi, Nobuhiko et al., "Voltage-Controlled Magnetic Anisotropy in Tb—Fe—Co/MgO/Gd—Fe MTJ Devices", IEE Transactions on Magnetics, vol. 53, No. 11, Nov. 1, 2017, p. 1-4.

Satoshi Sumi et al. "Interference induced enhancement of magneto-optical Kerr effect in ultrathin magnetic films", Scientific Reports, vol. 8, No. 776, (2018), DOI:10.1038/s41598-017-18794-w.

Sarls, R., "Towards Application of CoFeb—MgO Magnetic Tunnel Junctions with Perpendicular Anisotropy", Eindhoven University of Technology, Department of Applied Physics, Physics of Nanostructures Group, Feb. 8, 2012.

Weisheng Zhao, et al., "Failure Analysis in Magnetic Tunnel Junction Nanopillar with Interfacial Perpendicular Magnetic Anisotropy", Materials, vol. 9, No. 41, Jan. 12, 2016, www.mdpi.com/journal/materials, DOI:10.3390/ma9010041.

* cited by examiner

MAGNETIC PROPERTY MEASURING SYSTEMS, METHODS FOR MEASURING MAGNETIC PROPERTIES, AND METHODS FOR MANUFACTURING MAGNETIC MEMORY DEVICES USING THE SAME

CROSS-REFERENCE TO RELATED APPLICATION

This is a divisional application of U.S. application Ser. No. 15/933,659, filed Mar. 23, 2018, the entire contents of which are incorporated herein by reference.

BACKGROUND

Some example embodiments of the inventive concepts relate to magnetic property measuring systems, methods for measuring magnetic properties, and methods for manufacturing magnetic memory devices using the same. More particularly, some example embodiments of the inventive concepts relate to methods and systems for measuring magnetic properties using a magneto-optical Kerr effect (MOKE) and methods for manufacturing magnetic memory devices using the same.

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. A magnetic memory device, as described herein, may include a magnetic tunnel junction (MTJ) pattern. A magnetic tunnel junction pattern, as described herein, may include two magnetic layers and an insulating layer between the two magnetic layers. A resistance value of ("resistance value associated with") the magnetic tunnel junction pattern may be changed depending on magnetization directions of the two magnetic layers. For example, when the magnetization directions of the two magnetic layers are anti-parallel to each other, the magnetic tunnel junction pattern may have a relatively high resistance value. When the magnetization directions of the two magnetic layers are parallel to each other, the magnetic tunnel junction pattern may have a relatively low resistance value. A magnetic memory device may be configured to read/write data using a difference between the resistance values of the magnetic tunnel junction pattern.

SUMMARY

In some example embodiments of the inventive concepts, one or more systems and methods for measuring magnetic properties of magnetic tunnel junction patterns of magnetic tunnel junction patterns may be used to provide (e.g., manufacture, fabricate, assemble, etc.) one or more magnetic memory devices having one or more particular (e.g., desired) characteristics.

Some example embodiments of the inventive concepts may provide a measuring system using a polar magneto-optical Kerr effect (polar MOKE), which is capable of improving a signal-to-noise ratio.

Some example embodiments of the inventive concepts may also provide a method for easily measuring perpendicular magnetic properties of a magnetic tunnel junction pattern.

Some example embodiments of the inventive concepts may further provide a method for manufacturing a magnetic memory device, which is capable of improving mass production and quality stability.

In some example embodiments, a magnetic property measuring system may include a plurality of coil structures configured to apply a magnetic field to a sample, a light source configured to irradiate incident light to the sample, and a detector configured to detect a polarization of light reflected from the sample based on the incident light irradiated to the sample. The incident light may have a wavelength equal to or less than about 580 nm. The magnetic field may be perpendicular to a surface of the sample. Each coil structure of the plurality of coil structures may include a pole piece and a coil surrounding an outer circumferential surface of the pole piece.

In some example embodiments, a method for measuring magnetic properties may include preparing a sample, the sample including a substrate, a wiring structure on the substrate, and a plurality of magnetic tunnel junction patterns on the wiring structure and laterally spaced apart from each other. The method may include applying a magnetic field to the sample, the magnetic field perpendicular to a top surface of the substrate, irradiating incident light onto the sample, the incident light having a wavelength equal to or less than about 580 nm, detecting a polarization of light reflected from the sample based on the incident light being irradiated onto the sample, and determining one or more perpendicular magnetic properties of the plurality of magnetic tunnel junction patterns based on analyzing the detected polarization of the reflected light.

In some example embodiments, a method for manufacturing a magnetic memory device may include forming a magnetic tunnel junction layer on a substrate, patterning the magnetic tunnel junction layer to form magnetic tunnel junction patterns, measuring one or more perpendicular magnetic properties of the magnetic tunnel junction patterns subsequent to the patterning of the magnetic tunnel junction layer, and determining whether the measured one or more perpendicular magnetic properties are in an allowable range. The measuring of the one or more perpendicular magnetic properties of the magnetic tunnel junction patterns may include applying a magnetic field to the substrate, the magnetic field perpendicular to a top surface of the substrate, irradiating incident light onto the substrate, the incident light having a wavelength equal to or less than about 580 nm, and detecting a polarization of light reflected from the substrate based on the incident light being irradiated onto the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

When the terms "about," "approximately," or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
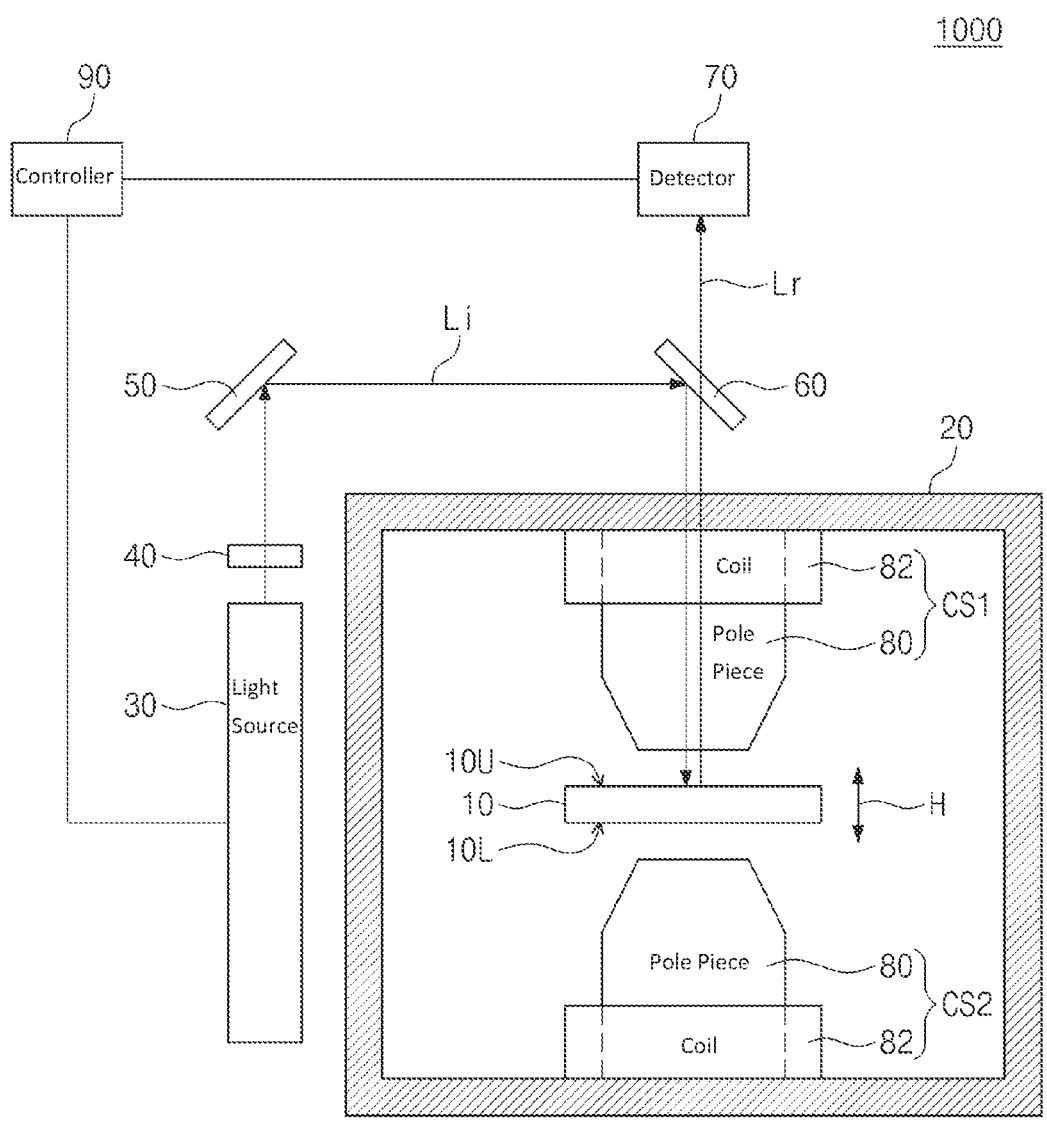
FIG. 1 is a conceptual diagram illustrating a magnetic property measuring system according to some example embodiments of the inventive concepts.

FIG. 1 is a conceptual diagram illustrating a magnetic property measuring system according to some example embodiments of the inventive concepts.

Referring to FIG. 1, a magnetic property measuring system 1000 may include a chamber 20 receiving ("configured to receive") a sample 10 therein, a plurality of coil structures CS1 and CS2 provided ("located") in the chamber 20 and applying ("configured to apply") a magnetic field H to the sample 10, a light source 30 irradiating ("configured to irradiate") incident light Li to the sample 10, and a detector 70 receiving ("configured to receive") reflected light Lr reflected from the sample 10. The magnetic property measuring system 1000 may further include a polarizer 40 polarizing ("configured to polarize) the incident light Li emitted from the light source 30, a reflection plate 50 for controlling ("configured to control") a light path of the incident light Li, and a beam splitter 60.

The plurality of coil structures CS1 and CS2 may be configured to apply the magnetic field H such that the magnetic field H has a direction that is perpendicular to a surface of the sample 10 (e.g., the magnetic field H is perpendicular to a surface of the sample 10). The sample 10 may have a top surface 10U and a bottom surface 10L opposite to each other. In some example embodiments, the magnetic field H applied to the sample 10 may be substantially perpendicular (e.g., perpendicular within manufacturing tolerances and/or material tolerances) to the top surface 10U and the bottom surface 10L of the sample 10. As referred to herein, a direction of the magnetic field H may refer to a direction of the magnetic field H in a space that is between the coil structures CS1 and CS2, for example as shown by the orientation of the double-arrow line representing the magnetic field H in FIG. 1. Restated, the coil structures CS1 and CS2 may be configured to generate a magnetic field H that has a direction, between the coil structures CS1 and CS2, that is perpendicular to a surface (e.g., 10U and/or 10L) of the sample 10. In some example embodiments, the coil structures CS1 and CS2 may be configured to generate a magnetic field H that has a direction, at least between the top surface 10U and the bottom surface 10L of the sample 10, that is perpendicular to one or more of the top surface 10U and the bottom surface 10L.

The coil structures CS1 and CS2 may be disposed to be (e.g., "may be") vertically spaced apart from each other with the sample 10 therebetween, such that the coil structures CS1 and CS2 are on opposite sides of the sample 10. For example, as shown in FIG. 1, the coil structures CS1 and CS2 may include a first coil structure CS1 adjacent to (e.g., "proximate to") the top surface 10U of the sample 10 and a second coil structure CS2 adjacent to the bottom surface 10L of the sample 10. Each coil structure of the coil structures CS1 and CS2 may include a pole piece 80 and a coil 82 surrounding an outer circumferential surface of the pole piece 80. The pole piece 80 may include, for example, a magnetic material. The sample 10 may be horizontally movable in a direction parallel to the top surface 10U (and/or the bottom surface 10L) of the sample 10.

The light source 30 may be a laser light source. The light source 30 may be used as a single light source of the magnetic property measuring system 1000. The incident light Li may be a continuous-wave laser light, and a wavelength of the incident light Li may range from about 320 nm to about 580 nm. Restated, the incident light Li may have a wavelength that ranges from about 320 nm to about 580 nm. For example, the incident light Li may be visible light having a wavelength that ranges from about 400 nm to about 500 nm. The wavelength of the incident light Li may not be greater than (e.g., may be equal to or less than) about 580 nm. The incident light Li may be polarized by the polarizer 40. The incident light Li may be reflected by the reflection plate 50 and the beam splitter 60 and may then be irradiated to the sample 10. The incident light Li may be irradiated perpendicularly to the top surface 10U of the sample 10. However, example embodiments of the inventive concepts are not limited thereto. In some example embodiments, the incident light Li may be irradiated obliquely to the top surface 10U of the sample 10. Based on the incident light Li being irradiated to the top surface 10U of the sample 10, reflected light Lr may be reflected from the sample 10 (e.g., reflected from the top surface 10U of the sample 10). The surface (e.g., top surface 10U) from which the reflected light Lr is reflected may be referred to herein as a reflection surface.

The detector 70 may detect ("may be configured to detect") a polarization of the reflected light Lr reflected from the sample 10. The reflected light Lr may pass through the beam splitter 60 so as to be guided to the detector 70 at least partially by the splitter 60.

The magnetic property measuring system 1000 may be configured to measure one or more perpendicular magnetic properties of the sample 10 by using a polar magneto-optical Kerr effect (polar MOKE). A magneto-optical Kerr effect means a phenomenon that a polarization of light is changed when the light is reflected from an object having magnetism (e.g., when the light is reflected from a magnetized surface), and the polar magneto-optical Kerr effect means a case in which a magnetized direction (e.g., magnetization vector) of the object is perpendicular to a surface of the object (e.g., the reflection surface) and is parallel to a plane (i.e., the plane of incidence) in which light is incident and reflected. The magnetic property measuring system 1000 may be a polar magneto-optical Kerr effect (polar MOKE) measuring system and may measure a degree of perpendicular magnetization of the surface of the sample 10 based on analyzing a polarization of light (i.e., a polarization of the reflected light Lr) which is incident on the top surface 10U of the sample 10 (e.g., as light Li) and is then reflected from the top surface 10U (e.g., as reflected light Lr). Thus, the plurality of coil structures CS1 and CS2, the light source 30, and the detector 70 may at least partially comprise a polar magneto-optical Kerr effect (polar MOKE) measuring system.

The magnetic property measuring system 1000 may further include a controller 90 that is coupled to the light source 30 and the detector 70. The controller 90 may be configured to control one or more operations of the light source 30 and the detector 70 and may be configured to process data obtained ("received") from the detector 70. The controller 90 may be configured to process, store and/or display the data, obtained from the detector 70, in various forms (e.g., numerical values, a graph and/or an image).

A method for measuring magnetic properties using the magnetic property measuring system 1000 will be described hereinafter.

Figure 2:
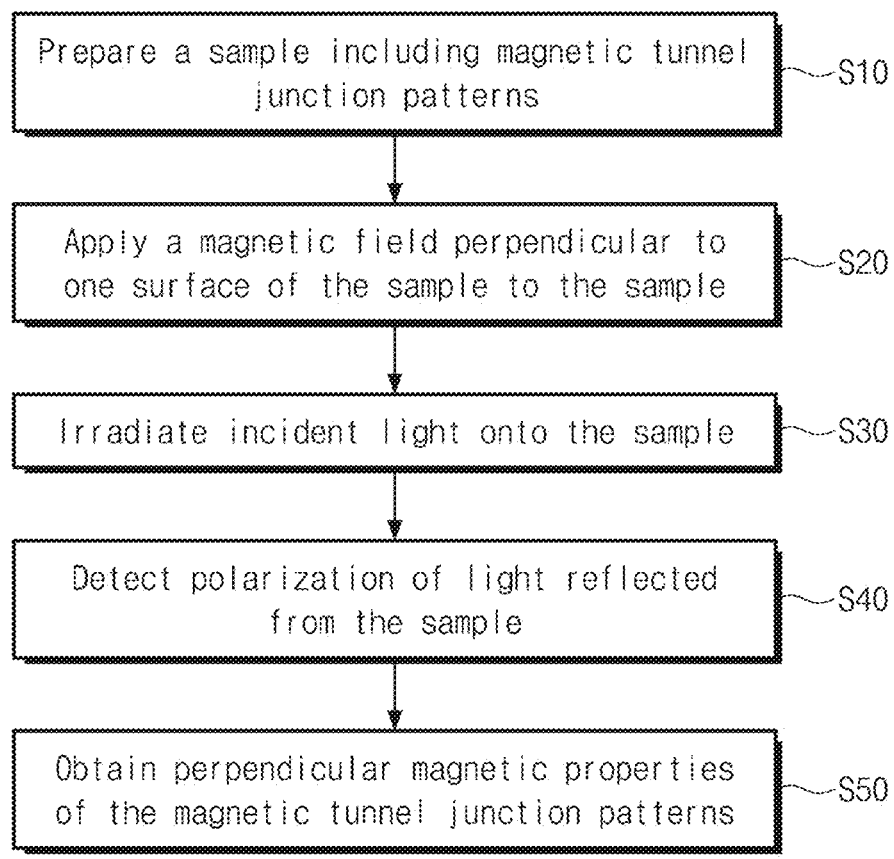
FIG. 2 is a flowchart illustrating a method for measuring magnetic properties, according to some example embodiments of the inventive concepts.
Figure 3:
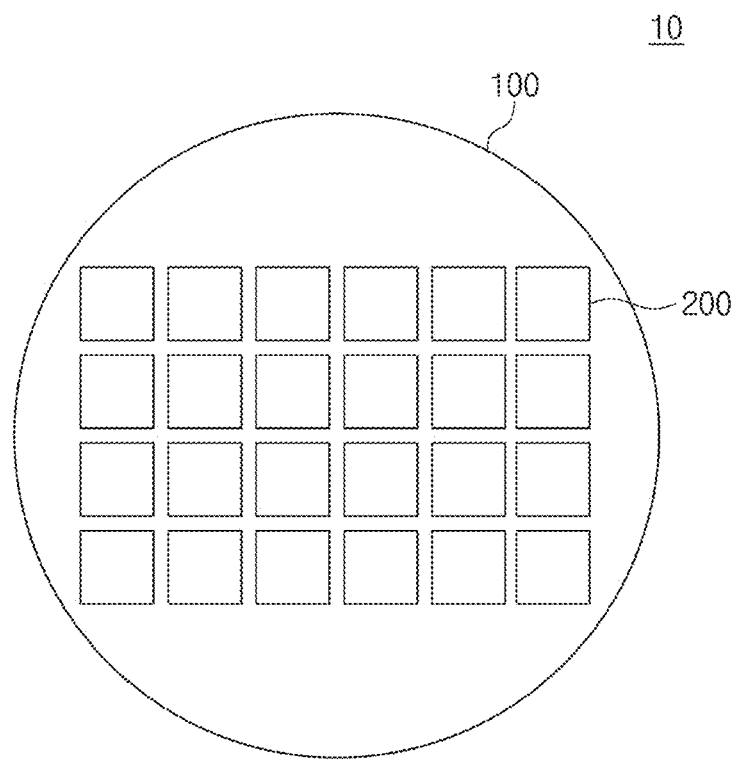
FIGS. 3 and 4 are plan views illustrating a method for measuring magnetic properties, according to some example embodiments of the inventive concepts.
Figure 4:
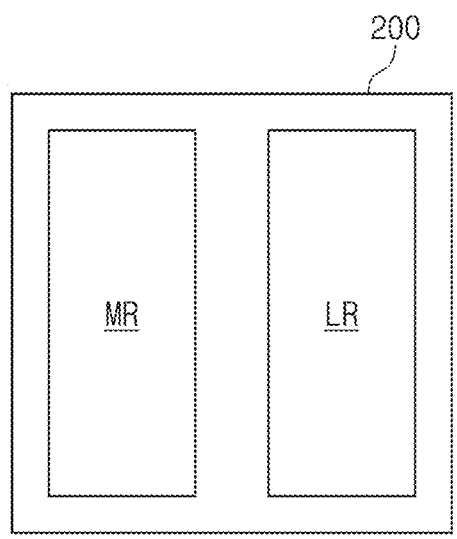
Figure 5:
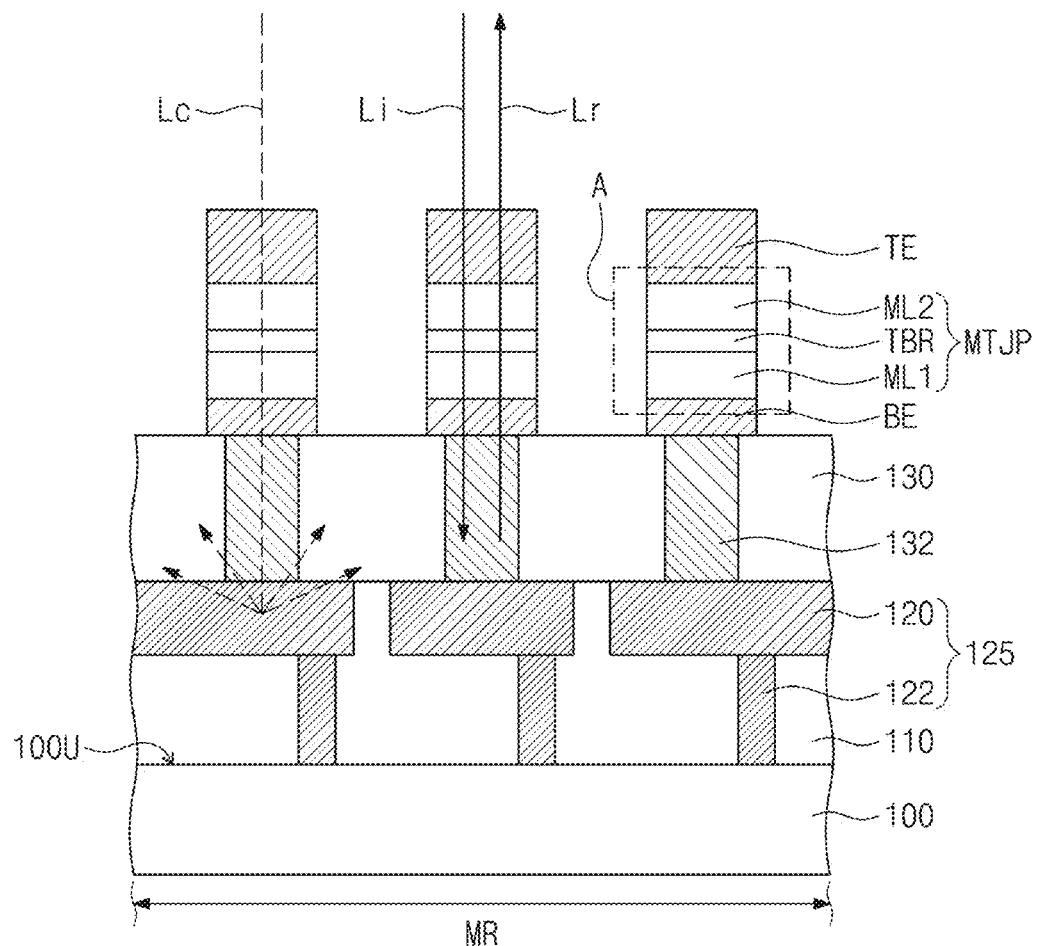
FIG. 5 is a cross-sectional view illustrating a method for measuring magnetic properties, according to some example embodiments of the inventive concepts.
Figure 6:
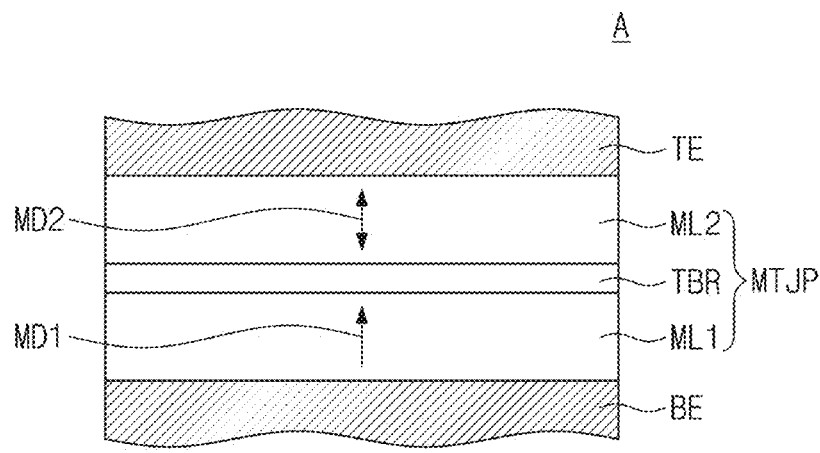
FIG. 6 is an enlarged view of a portion 'A' of FIG. 5.

FIG. 2 is a flowchart illustrating a method for measuring magnetic properties, according to some example embodiments of the inventive concepts. FIGS. 3 and 4 are plan views illustrating a method for measuring magnetic properties, according to some example embodiments of the inventive concepts. FIG. 5 is a cross-sectional view illustrating a method for measuring magnetic properties, according to some example embodiments of the inventive concepts. FIG. 6 is an enlarged view of a portion 'A' of FIG. 5.

Referring to FIGS. 2, 3, and 4, the sample 10 including magnetic tunnel junction patterns may be prepared (S10). The sample 10 may include a wafer 100 including a plurality of chip regions 200. In the present specification, the wafer 100 may be referred to as 'a substrate'. The substrate 100 may be a semiconductor substrate that includes silicon (Si), silicon on an insulator (SOI), silicon-germanium (SiGe), germanium (Ge), or gallium-arsenic (GaAs). Each chip region 200 of the chip regions 200 may include a memory region MR on which a memory device is provided ("located"), and a logic region LR on which a logic device is provided. The memory device may include a magnetic memory device, and the logic device may include logic cells for performing ("configured to perform") a Boolean logic function (e.g., INVERTER, AND, OR, NAND, or NOR) or a storage function (e.g., FLIP-FLOP). In some example embodiments, an area of the memory region MR may be smaller than an area of the logic region LR in each of the chip regions 200.

Referring to FIGS. 2, 5, and 6, a wiring structure 125 may be provided ("located") on the memory region MR of the substrate 100. The wiring structure 125 may include wiring lines 120 spaced apart from (e.g., isolated from direct contact with) the substrate 100 and contacts 122 connected to the wiring lines 120. The wiring lines 120 may be electrically connected to the substrate 100 through the contacts 122. The wiring lines 120 and the contacts 122 may include a metal material. For example, the wiring lines 120 and the contacts 122 may include copper (Cu). A first interlayer insulating layer 110 may be provided on the memory region MR of the substrate 100 to cover the wiring structure 125. The first interlayer insulating layer 110 may include at least one of an oxide layer, a nitride layer, or an oxynitride layer.

A second interlayer insulating layer 130 may be provided on the first interlayer insulating layer 110, and a plurality of bottom electrode contacts 132 may be provided in the second interlayer insulating layer 130. Each bottom electrode contact 132 of the bottom electrode contacts 132 may penetrate the second interlayer insulating layer 130 so as to be connected to a corresponding one wiring line 120 of the wiring lines 120. The second interlayer insulating layer 130 may include at least one of an oxide layer, a nitride layer, or an oxynitride layer, and the bottom electrode contacts 132 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

The magnetic tunnel junction patterns MTJP ("plurality of magnetic tunnel junction patterns MTJP") may be provided on the second interlayer insulating layer 130. The magnetic tunnel junction patterns MTJP may include an array of a plurality of magnetic tunnel junction patterns MTJP. The magnetic tunnel junction patterns MTJP may be laterally spaced apart from each other (e.g., isolated from direct contact with each other) on the memory region MR of the substrate 100. In other words, the magnetic tunnel junction patterns MTJP may be spaced apart from each other in a direction parallel to a top surface 100U of the substrate 100. The wiring structure 125 may be between the substrate 100 and an array of the plurality of magnetic tunnel junction patterns MTJP. The wiring structure 125 may include a metal. The magnetic tunnel junction patterns MTJP may be connected to the bottom electrode contacts 132, respectively. A bottom electrode BE may be provided between each of the magnetic tunnel junction patterns MTJP and each of the bottom electrode contacts 132. A top electrode TE may be provided on each of the magnetic tunnel junction patterns MTJP and may be spaced apart from the bottom electrode BE with each of the magnetic tunnel junction patterns MTJP interposed therebetween. The bottom electrode BE and the top electrode TE may include a conductive material. For example, the bottom electrode BE may include a conductive metal nitride (e.g., titanium nitride or tantalum nitride), and the top electrode TE may include at least one of a metal (e.g., tungsten) and a conductive metal nitride (e.g., titanium nitride or tantalum nitride).

Each of the magnetic tunnel junction patterns MTJP may include a first magnetic pattern ML1, a second magnetic pattern ML2, and a tunnel barrier pattern TBR between the first magnetic pattern ML1 and the second magnetic pattern ML2. The first magnetic pattern ML1 and the second magnetic pattern ML2 may be spaced apart from each other. Each magnetic pattern of the first magnetic pattern ML1 and the second magnetic pattern ML2 may have a magnetization direction perpendicular to the top surface 100U of the substrate 100. One of the first and second magnetic patterns ML1 and ML2 may be a reference layer having a magnetization direction that is fixed in one direction, and the other of the first and second magnetic patterns ML1 and ML2 may be a free layer having a magnetization direction that is switchable between separate stable magnetic states. Magnetization directions MD1 and MD2 of the first and second magnetic patterns ML1 and ML2 may be substantially perpendicular to an interface between the first magnetic pattern ML1 and the tunnel barrier pattern TBR. The magnetization directions MD1 and MD2 of the first and second magnetic patterns ML1 and ML2 may be substantially perpendicular to the top surface 100U of the substrate 100. FIG. 6 illustrates an example embodiment in which the first magnetic pattern ML1 is the reference layer having a magnetization direction MD1 fixed in one direction and the second magnetic pattern ML2 is the free layer having a changeable magnetization direction MD2. However, embodiments of the inventive concepts are not limited thereto. In certain embodiments, unlike FIG. 6, the first magnetic pattern ML1 may be the free layer having the changeable magnetization direction, and the second magnetic pattern ML2 may be the reference layer having the magnetization direction fixed in one direction.

Each of the first and second magnetic patterns ML1 and ML2 may include at least one of an intrinsic perpendicular magnetic material or an extrinsic perpendicular magnetic material. The intrinsic perpendicular magnetic material may include a material that has perpendicular magnetic properties even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ lattice structure, a CoPt alloy having a hexagonal close packed (HCP) lattice structure, or a perpendicular magnetic structure. The perpendicular magnetic material having the $L1_0$ lattice structure may include at least one of FePt having the $L1_0$ lattice structure, FePd having the $L1_0$ lattice structure, CoPd having the $L1_0$ lattice structure, or CoPt having the $L1_0$ lattice structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. The extrinsic perpendicular magnetic material may include a material that has intrinsic horizontal magnetic properties but has perpendicular magnetic properties by an external factor. For example, the extrinsic perpendicular magnetic material may have the perpendicular magnetic properties by magnetic anisotropy induced by a junction of the tunnel barrier pattern TBR and the first magnetic pattern ML1 (or the second magnetic pattern ML2). The extrinsic perpendicular magnetic material may include, for example, CoFeB. The tunnel barrier pattern TBR may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN).

The sample 10 may include the substrate 100 and the magnetic tunnel junction patterns MTJP provided on the substrate 100. The magnetic tunnel junction patterns MTJP may be perpendicular magnetic tunnel junction patterns in which the first and second magnetic patterns ML1 and ML2 have the magnetization directions MD1 and MD2 perpendicular to a plane (e.g., the interface between the first magnetic pattern ML1 and the tunnel barrier pattern TBR). The magnetic property measuring system 1000 may be the polar MOKE measuring system and may be used to measure perpendicular magnetic properties of the perpendicular magnetic tunnel junction patterns.

Referring to FIGS. 1, 2, and 5, the sample 10 may be provided into the chamber 20 of the magnetic property measuring system 1000. The magnetic field H having a direction that is perpendicular to one surface of the sample 10 may be applied to the sample 10 (S20). The magnetic field H may be perpendicular to the top surface 100U of the substrate 100. The top surface 100U of the substrate 100 may correspond to the top surface 10U of the sample 10 described with reference to FIG. 1. Since the magnetic field H is applied perpendicularly to the top surface 100U of the substrate 100, the first and second magnetic patterns ML1 and ML2 may have magnetization directions substantially perpendicular (e.g., perpendicular within manufacturing tolerances and/or material tolerances) to the top surface 100U of the substrate 100. In other words, the magnetic tunnel junction patterns MTJP may be caused to have one or more perpendicular magnetic properties based on the magnetic field H being applied to the sample 10.

The incident light Li may be irradiated onto the sample 10 (S30). The incident light Li may be irradiated to be substantially perpendicular (e.g., perpendicular within manufacturing tolerances and/or material tolerances) to the top surface 100U of the substrate 100. However, example embodiments of the inventive concepts are not limited thereto. In certain embodiments, the incident light Li may be irradiated obliquely to the top surface 100U of the substrate 100, unlike FIG. 5. The incident light Li may be a continuous-wave laser light emitted from the single light source 30. The wavelength of the incident light Li may range from about 320 nm to about 580 nm (e.g., the incident light Li may have a wavelength that ranges from about 320 nm to about 580 nm). For example, the incident light Li may be visible light having a wavelength that ranges from about 400 nm to about 500 nm. The wavelength of the incident light Li may not be greater than (e.g., equal to or less than) about 580 nm. The incident light Li may be irradiated onto a particular (or, alternatively, predetermined) one of the chip regions 200 of the substrate 100 illustrated in FIGS. 3 and 4 and may be irradiated onto the memory region MR in the particular (or, alternatively, predetermined) chip region 200.

A polarization of the reflected light Lr reflected from the sample 10 (e.g., reflected light Lr that is reflected from the sample 10 based on the incident light Li being irradiated onto the sample 10) may be detected ("determined") (S40). In more detail, the reflected light Lr may pass through the beam splitter 60 so as to be guided to the detector 70. The detector 70 may detect the polarization of the reflected light Lr.

The one or more perpendicular magnetic properties of the magnetic tunnel junction patterns MTJP may be obtained ("determined") based on analyzing the polarization of the reflected light Lr (S50). The obtaining of the perpendicular magnetic properties of the magnetic tunnel junction patterns MTJP may include obtaining (determining, generating, etc.) one or more magnetic hysteresis curves associated with the plurality of magnetic tunnel junction patterns MTJP. The one or more magnetic hysteresis curves may be obtained (determined, generated, etc.) based on using a polar magneto-optical Kerr effect (polar MOKE). Information associated with the one or more perpendicular magnetic properties of the magnetic tunnel junction patterns MTJP may be measured based on processing the one or more magnetic hysteresis curves. For example, the one or more perpendicular magnetic properties of the magnetic tunnel junction patterns MTJP may include an exchange magnetic field (Hex), a coercive force (Hc), and/or dispersion of coercive forces Hc of the magnetic tunnel junction patterns MTJP in a unit chip.

In some example embodiments, one or more subsequent processes, including one or more manufacturing operations, may be selectively performed based upon whether the perpendicular magnetic properties have values that are in one or more respective particular ranges of values (e.g., an "allowable ranges"). Such subsequent processes may include incorporating a magnetic tunnel junction pattern MTJP, including a magnetic tunnel junction pattern MTJP included in the sample 10, into a memory element ME of a unit memory cell MC.

Figure 7:
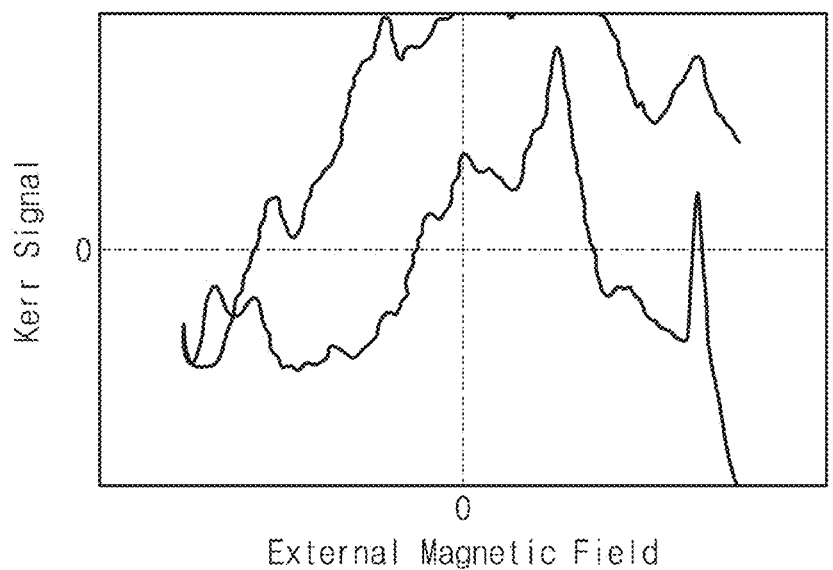
FIG. 7 is a magnetic hysteresis curve of a magnetic tunnel junction pattern, which is obtained using a conventional magnetic property measuring system.
Figure 8:
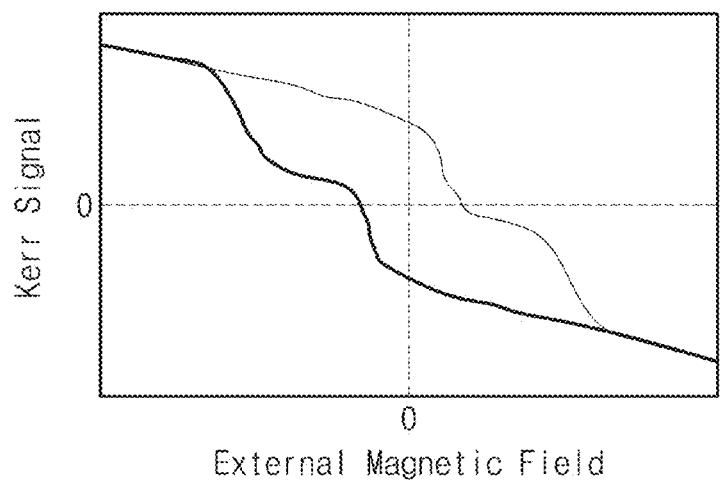
FIGS. 8 and 9 are magnetic hysteresis curves of magnetic tunnel junction patterns, which are obtained using a magnetic property measuring system according to some example embodiments of the inventive concepts.
Figure 9:
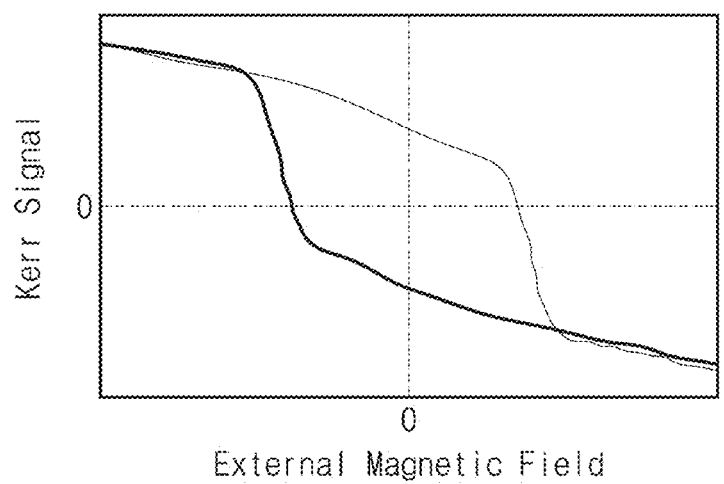

FIG. 7 is a magnetic hysteresis curve of a magnetic tunnel junction pattern, which is obtained using a conventional magnetic property measuring system. FIGS. 8 and 9 are magnetic hysteresis curves of magnetic tunnel junction patterns, which are obtained using a magnetic property measuring system according to some example embodiments of the inventive concepts.

Referring to FIGS. 5 and 7, a general polar MOKE measuring system may measure a degree of perpendicular magnetization of a surface of the sample 10 by using incident light Lc having a long wavelength greater than about 580 nm. In the event that the sample 10 includes underlying patterns (e.g., the bottom electrode contacts 132 and the wiring structure 125) disposed under the magnetic tunnel junction patterns MTJP, the long-wavelength incident light Lc irradiated onto the sample 10 may be diffusely reflected by the underlying patterns (in particular, the wiring structure 125) including a metal material. Thus, it may be difficult to detect polarization of reflected light reflected from the sample 10 based on using such incident light Lc having a wavelength greater than about 580 nm. As illustrated in FIG. 7, when the long-wavelength incident light Lc is irradiated onto the sample 10 including the underlying patterns, noise may be increased in the general polar MOKE measuring system. Thus, it may be difficult to obtain reliable magnetic hysteresis curves of the magnetic tunnel junction patterns MTJP of the sample 10 based on irradiating the sample 10 with incident light Lc having a wavelength greater than about 580 nm.

Referring to FIGS. 5, 8, and 9, the magnetic property measuring system 1000 according to the inventive concepts may be the polar MOKE measuring system using the incident light Li having a relatively short wavelength. In this case, even though the sample 10 includes the underlying patterns (e.g., the bottom electrode contacts 132 and the wiring structure 125) disposed under the magnetic tunnel junction patterns MTJP, the incident light Li having the relatively short wavelength (e.g., equal to or less than about 580 nm, between about 320 nm to about 580 nm, etc.) may not reach the underlying patterns (in particular, the wiring structure 125). Thus, it is possible to inhibit the incident light Li from being diffusely reflected by the wiring structure 125. As a result, the magnetic property measuring system 1000 may obtain signals sufficient to obtain reliable magnetic hysteresis curves of the magnetic tunnel junction patterns MTJP of the sample 10. In other words, the magnetic property measuring system 1000 may have an improved signal-to-noise (S/N) ratio with respect to the sample 10 including the underlying patterns (e.g., the bottom electrode contacts 132 and the wiring structure 125). When the incident light Li having the relatively short wavelength is irradiated onto the sample 10 including the underlying patterns, the reliable magnetic hysteresis curves of the magnetic tunnel junction patterns MTJP of the sample 10 may be obtained as illustrated in FIGS. 8 and 9. FIG. 8 illustrates a magnetic hysteresis curve of an entire stack structure of the magnetic tunnel junction pattern MTJP including the first and second magnetic patterns ML1 and ML2, and FIG. 9 illustrates a magnetic hysteresis curve of the free layer (e.g., the second magnetic pattern ML2) of the magnetic tunnel junction pattern MTJP.

The above example embodiments describe the method for measuring the perpendicular magnetic properties of the magnetic tunnel junction patterns MTJP by using the magnetic property measuring system 1000. However, example embodiments of the inventive concepts are not limited thereto. In some example embodiments, the magnetic property measuring system 1000 may also be used to measure one or more perpendicular magnetic properties of a magnetic tunnel junction layer which is formed on the sample 10 including the underlying patterns.

Figure 10:
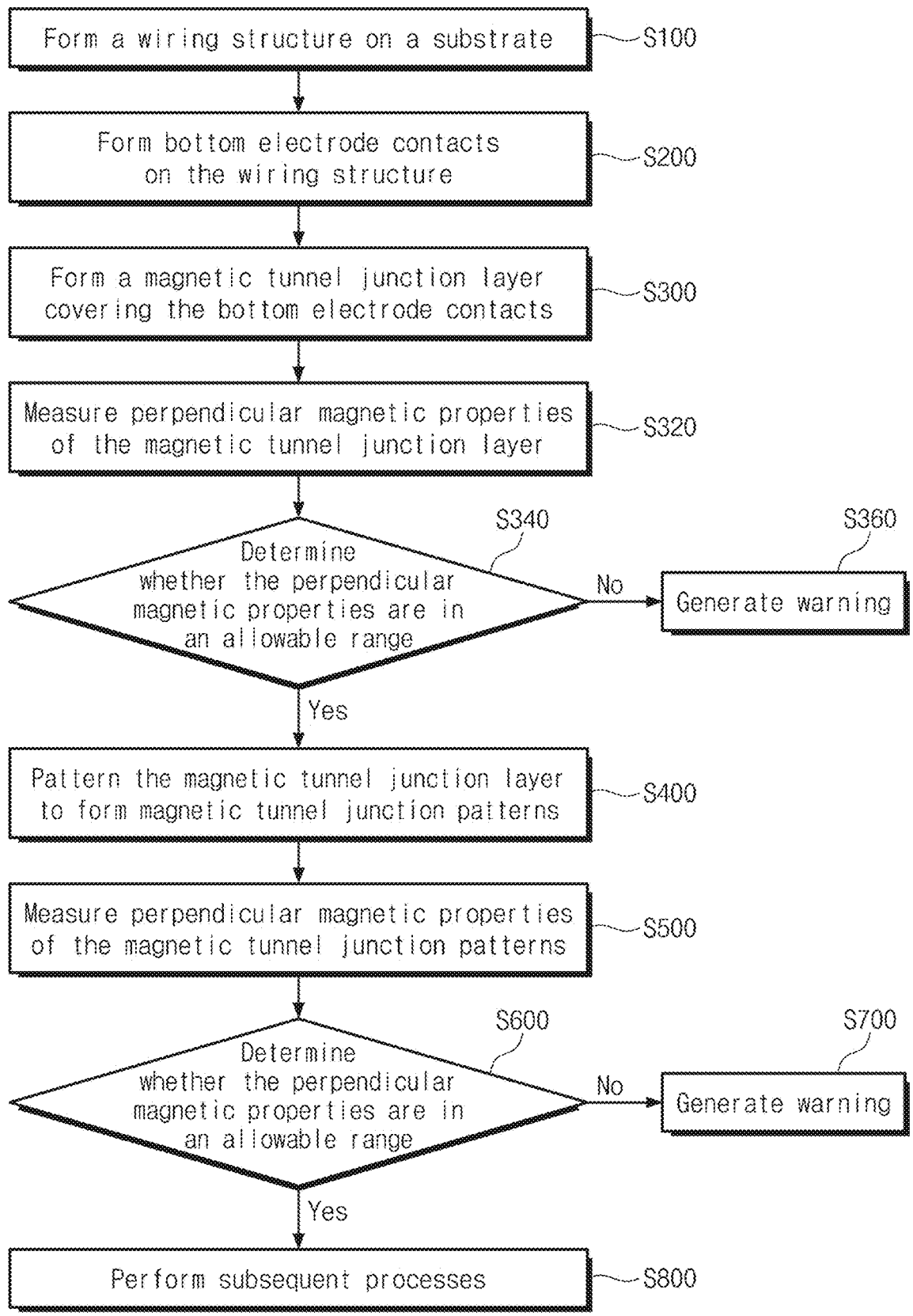
FIG. 10 is a flowchart illustrating a method for manufacturing a magnetic memory device using a magnetic property measuring system according to some example embodiments of the inventive concepts.

FIG. 10 is a flowchart illustrating a method for manufacturing a magnetic memory device using a magnetic property measuring system according to some example embodiments of the inventive concepts. FIGS. 11 to 14 are cross-sectional views illustrating a method for manufacturing a magnetic memory device using a magnetic property measuring system according to some example embodiments of the inventive concepts.

Figure 11:
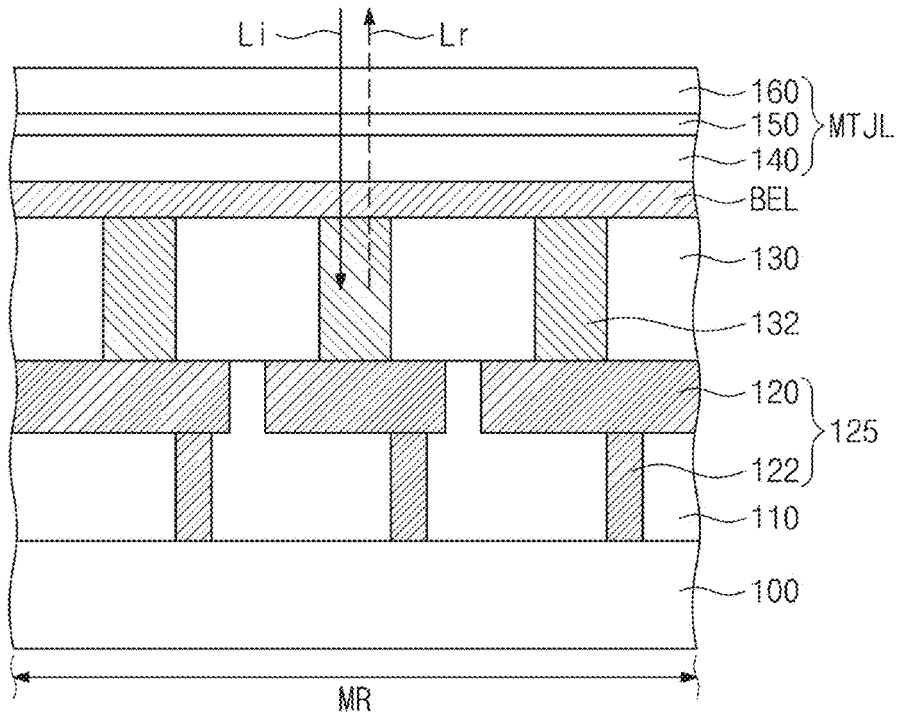
FIGS. 11, 12, 13, and 14 are cross-sectional views illustrating a method for manufacturing a magnetic memory device using a magnetic property measuring system according to some example embodiments of the inventive concepts.

Referring to FIGS. 10 and 11, selection elements (not shown) may be formed on the memory region MR of the substrate 100. The substrate 100 may be a semiconductor substrate that includes silicon (Si), silicon on an insulator (SOI), silicon-germanium (SiGe), germanium (Ge), or gallium-arsenic (GaAs). The selection elements may be field effect transistors or diodes. Thereafter, a wiring structure 125 may be formed on the substrate 100 (S100). The wiring structure 125 may be electrically connected to the substrate 100. The wiring structure 125 may include wiring lines 120 spaced apart from the substrate 100 and contacts 122 connected to the wiring lines 120. The wiring lines 120 may be electrically connected to the substrate 100 through the contacts 122. At least one of the wiring lines 120 may be electrically connected to one terminal of a corresponding selection element through a corresponding contact 122. The wiring lines 120 and the contacts 122 may include a metal material. For example, the wiring lines 120 and the contacts 122 may include copper (Cu). A first interlayer insulating layer 110 may be formed on the substrate 100 to cover the selection elements and the wiring structure 125. The first interlayer insulating layer 110 may be formed of a single layer or multi-layer including at least one of an oxide layer, a nitride layer, or an oxynitride layer.

Bottom electrode contacts 132 may be formed on the wiring structure 125 (S200). Each of the bottom electrode contacts 132 may be electrically connected to the one terminal of a corresponding selection element through a corresponding wiring line 120. The bottom electrode contacts 132 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide). A second interlayer insulating layer 130 may be formed on the first interlayer insulating layer 110 and may cover the bottom electrode contacts 132. The second interlayer insulating layer 130 may be formed of ("may at least partially comprise") a single layer or multi-layer including at least one of an oxide layer, a nitride layer, or an oxynitride layer. The wiring structure 125 and the bottom electrode contacts 132 may include a metal.

A bottom electrode layer BEL and a magnetic tunnel junction layer MTJL, which cover the bottom electrode contacts 132, may be formed on the second interlayer insulating layer 130, such that at least the magnetic tunnel junction layer MTJL is formed on the substrate 100 (S300). The magnetic tunnel junction layer MTJL may cover respective top surfaces of the plurality of bottom electrode contacts 132. The bottom electrode layer BEL may be disposed between the second interlayer insulating layer 130 and the magnetic tunnel junction layer MTJL. For example, the bottom electrode layer BEL may include a conductive metal nitride (e.g., titanium nitride or tantalum nitride). The magnetic tunnel junction layer MTJL may include a first magnetic layer 140, a tunnel barrier layer 150, and a second magnetic layer 160, which are sequentially stacked on the bottom electrode layer BEL. Each of the first and second magnetic layers 140 and 160 may include at least one of the intrinsic perpendicular magnetic material or the extrinsic perpendicular magnetic material, described above. The tunnel barrier layer 150 may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN).

Perpendicular magnetic properties of the magnetic tunnel junction layer MTJL may be measured after the formation of the magnetic tunnel junction layer MTJL (S320). The perpendicular magnetic properties of the magnetic tunnel junction layer MTJL may be measured using the magnetic property measuring system 1000 of FIG. 1.

In more detail, the sample 10 including the substrate 100 having the magnetic tunnel junction layer MTJL may be prepared. The sample 10 may be provided into the chamber 20 of the magnetic property measuring system 1000 illustrated in FIG. 1. Thereafter, as described with reference to FIG. 2, the magnetic field H perpendicular to the top surface 100U of the substrate 100 may be applied to the sample 10 (S20), the incident light Li may be irradiated onto the sample 10 (S30), and polarization of the reflected light Lr reflected from the sample 10 may be detected (S40). The perpendicular magnetic properties of the magnetic tunnel junction layer MTJL may be obtained by analyzing the polarization of the reflected light Lr. The obtaining of the perpendicular magnetic properties of the magnetic tunnel junction layer MTJL may include obtaining a magnetic hysteresis curve of the magnetic tunnel junction layer MTJL. Information on the perpendicular magnetic properties (e.g., an exchange magnetic field (Hex), a coercive force (Hc), and/or dispersion of coercive forces Hc of the magnetic tunnel junction layer MTJL in a unit chip) of the magnetic tunnel junction layer MTJL may be measured through the magnetic hysteresis curve. The incident light Li having the relatively short wavelength may be irradiated onto the top surface 100U of the substrate 100, and thus it is possible to inhibit the incident light Li from being diffusely reflected by underlying patterns (e.g., the bottom electrode contacts 132 and the wiring structure 125) formed under the magnetic tunnel junction layer MTJL. Thus, a reliable magnetic hysteresis curve may be obtained from the magnetic tunnel junction layer MTJL.

Figure 12:
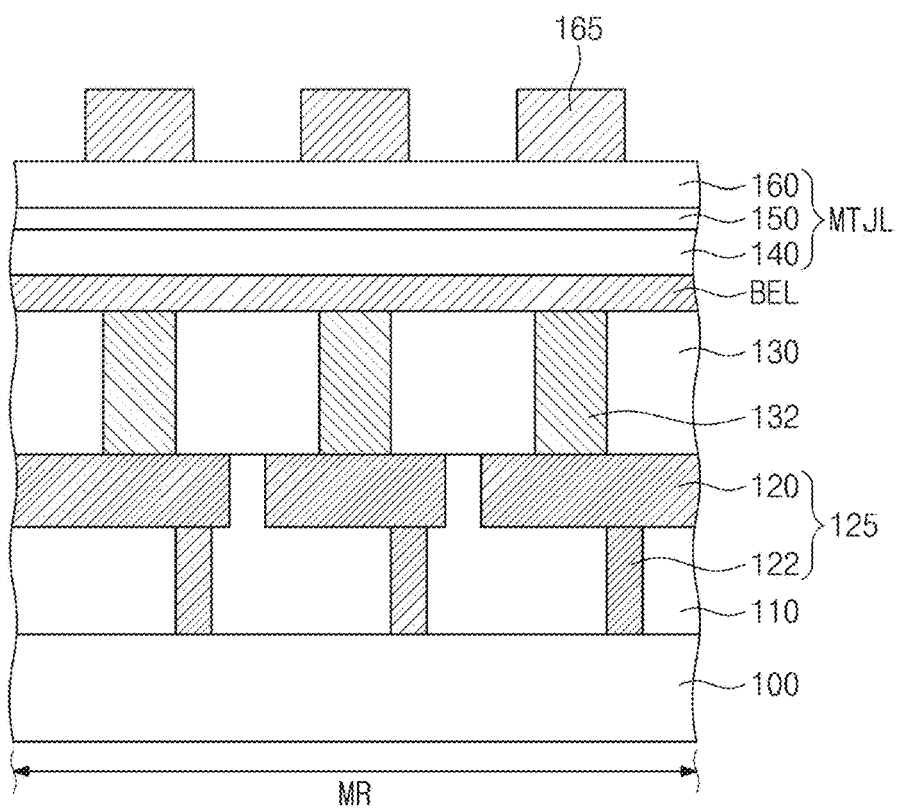

Referring to FIGS. 10 and 12, it may be determined whether the measured perpendicular magnetic properties of the magnetic tunnel junction layer MTJL are in an allowable range (S340). When the measured perpendicular magnetic properties are not in the allowable range, warning may be generated (S360). When the measured perpendicular magnetic properties are in the allowable range, conductive mask patterns 165 may be formed on the magnetic tunnel junction layer MTJL. The conductive mask patterns 165 may define regions in which magnetic tunnel junction patterns will be formed. For example, the conductive mask patterns 165 may include a conductive metal nitride (e.g., titanium nitride or tantalum nitride).

Figure 13:
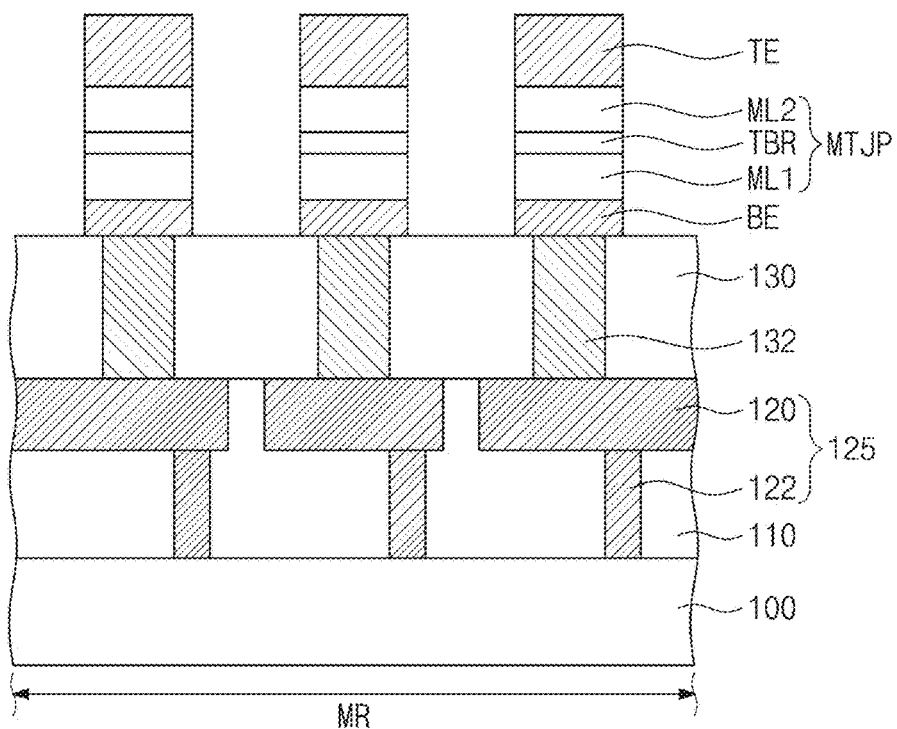

Referring to FIGS. 10 and 13, the magnetic tunnel junction layer MTJL and the bottom electrode layer BEL may be sequentially patterned using the conductive mask patterns 165 as an etch mask to form magnetic tunnel junction patterns MTJP and bottom electrodes BE (S400). The conductive mask patterns 165 may function as top electrodes TE, respectively. Each of the magnetic tunnel junction patterns MTJP may include a first magnetic pattern ML1, a tunnel barrier pattern TBR, and a second magnetic pattern ML2, which are sequentially stacked on each of the bottom electrodes BE. The magnetic tunnel junction patterns MTJP may be spaced apart from each other in a direction parallel to the top surface 100U of the substrate 100, and the bottom electrodes BE may be provided under the magnetic tunnel junction patterns MTJP, respectively.

Referring to FIGS. 10 and 5, one or more perpendicular magnetic properties of the magnetic tunnel junction patterns MTJP may be measured after ("subsequent to") the process of patterning the magnetic tunnel junction layer MTJL (S500). The one or more perpendicular magnetic properties of the magnetic tunnel junction patterns MTJP may be measured using the magnetic property measuring system 1000 of FIG. 1.

In more detail, the measurement of the one or more perpendicular magnetic properties of the magnetic tunnel junction patterns MTJP may include preparing the sample 10 including the substrate 100 having the magnetic tunnel junction patterns MTJP (S10), providing the sample 10 into the chamber 20 of the magnetic property measuring system 1000 of FIG. 1, applying the magnetic field H, such that the direction of the magnetic field H, at least between the bottom surface 10L and top surface 10U of the sample 10, is perpendicular to the top surface 100U of the substrate 100, to the sample 10 (S20), irradiating the incident light Li onto the sample 10 (S30), detecting a polarization of the reflected light Lr reflected from the sample 10 based on the incident light LI being irradiated onto the sample 10 (S40), and obtaining ("determining") the one or more perpendicular magnetic properties of the plurality of magnetic tunnel junction patterns MTJP by ("based on") analyzing the detected polarization of the reflected light Lr (S50). The obtaining of the perpendicular magnetic properties of the magnetic tunnel junction patterns MTJP may include obtaining ("determining," "generating," etc.) one or more magnetic hysteresis curves of ("associated with") the magnetic tunnel junction patterns MTJP. The one or more magnetic hysteresis curves may be obtained based on using a polar magneto-optical Kerr effect (polar MOKE). Information on ("associated with") the one or more perpendicular magnetic properties of the magnetic tunnel junction patterns MTJP may be measured through the one or more magnetic hysteresis curves. For example, the one or more perpendicular magnetic properties of the magnetic tunnel junction patterns MTJP may include an exchange magnetic field (Hex), a coercive force (Hc), and/or dispersion of coercive forces Hc of the magnetic tunnel junction patterns MTJP in a unit chip.

Figure 14:
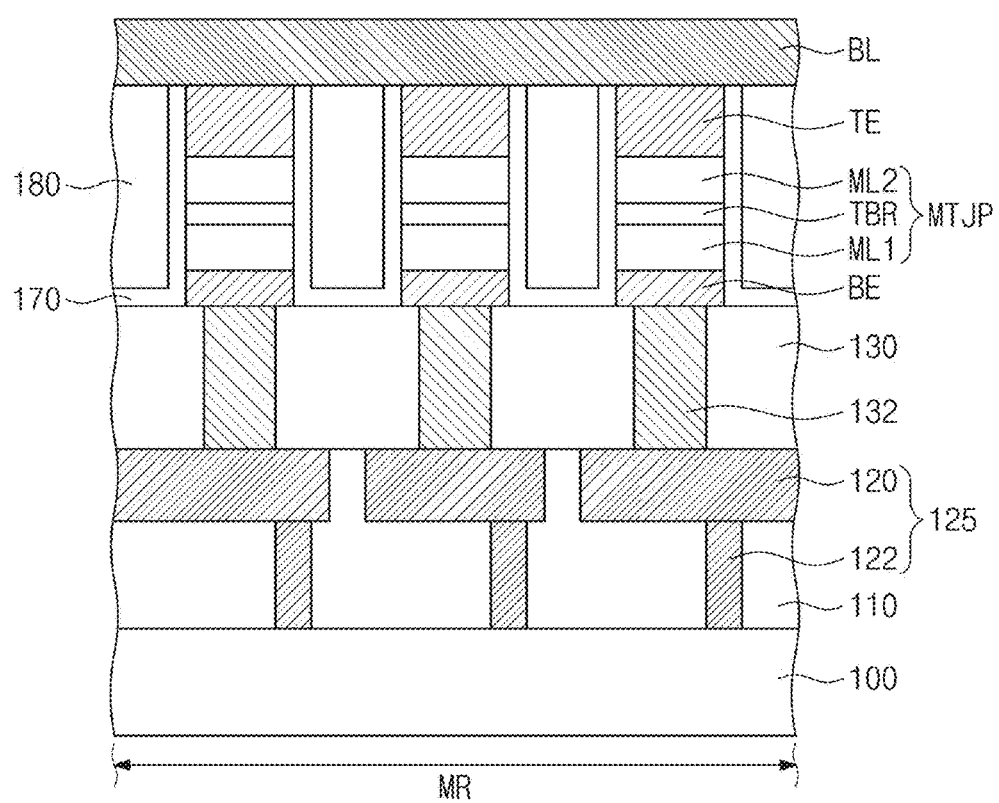

Referring to FIGS. 10 and 14, it may be determined whether the measured one or more perpendicular magnetic properties of the magnetic tunnel junction patterns MTJP are in an allowable range ("a particular range of one or more particular perpendicular magnetic property values") (S600). When the measured one or more perpendicular magnetic properties are not in the allowable range, a warning signal may be generated (S700). When the measured perpendicular magnetic properties are in the allowable range, subsequent processes may be performed (S800). Restated, one or more subsequent processes (S800) may be selectively performed based upon whether the measured perpendicular magnetic properties are in the allowable range. Such subsequent processes may include incorporating a magnetic tunnel junction pattern MTJP, including a magnetic tunnel junction pattern MTJP included in the sample 10, into a memory element ME of a unit memory cell MC. In more detail, a spacer layer 170 and a third interlayer insulating layer 180 may be sequentially formed on the second interlayer insulating layer 130 and the plurality of magnetic tunnel junction patterns MTJP such that the spacer layer 170 and the third interlayer insulating layer 180 cover the magnetic tunnel junction patterns MTJP; such an operation may be selectively performed based on a determination that the measured one or more perpendicular magnetic properties are in an allowable range. The spacer layer 170 may be formed to conformally cover sidewalls of the magnetic tunnel junction patterns MTJP and a top surface of the second interlayer insulating layer 130 between the magnetic tunnel junction patterns MTJP. The third interlayer insulating layer 180 may be formed to fill a space between the magnetic tunnel junction patterns MTJP. Each of the spacer layer 170 and the third interlayer insulating layer 180 may include at least one of an oxide layer, a nitride layer, or an oxynitride layer. Thereafter, a bit line BL may be formed on the third interlayer insulating layer 180. The bit line BL may be connected to corresponding ones of the magnetic tunnel junction patterns MTJP. The bit line BL may include at least one of a metal (e.g., titanium, tantalum, copper, aluminum, or tungsten) or a conductive metal nitride (e.g., titanium nitride or tantalum nitride).

Figure 15:
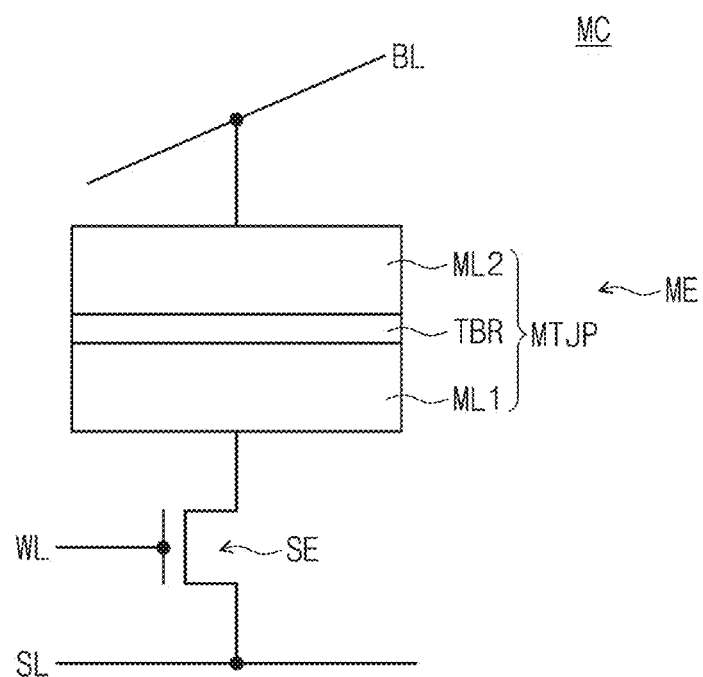
FIG. 15 is a circuit diagram illustrating a unit memory cell of a magnetic memory device manufactured according to some example embodiments of the inventive concepts.

FIG. 15 is a circuit diagram illustrating a unit memory cell of a magnetic memory device manufactured according to some example embodiments of the inventive concepts.

Referring to FIG. 15, a unit memory cell MC may include a memory element ME and a selection element SE which are connected in series to each other. The memory element ME may be connected between a bit line BL and the selection element SE. The selection element SE may be connected between the memory element ME and a source line SL and may be controlled by a word line WL. The memory element ME may include the magnetic tunnel junction pattern MTJP which includes the first and second magnetic patterns ML1 and ML2 and the tunnel barrier pattern TBR disposed between the first and second magnetic patterns ML1 and ML2. One of the first and second magnetic patterns ML1 and ML2 may be a reference layer which has a magnetization direction fixed regardless of an external magnetic field in a use environment, and the other of the first and second magnetic patterns ML1 and ML2 may be a free layer of which a magnetization direction is changeable by an external magnetic field or spin torque of electrons in a program current. An electrical resistance of the magnetic tunnel junction pattern MTJP when the magnetization directions of the reference layer and the free layer are anti-parallel to each other may be much greater than that of the magnetic tunnel junction pattern MTJP when the magnetization directions of the reference layer and the free layer are parallel to each other. In other words, the electrical resistance of the magnetic tunnel junction pattern MTJP may be adjusted by changing the magnetization direction of the free layer. Thus, logical data may be stored in the memory element ME of the unit memory cell MC by using an electrical resistance difference according to the magnetization directions of the reference layer and the free layer.

According to the inventive concepts, the magnetic property measuring system 1000 may be the polar MOKE measuring system using the incident light Li having the relatively short wavelength. In this case, even though the sample 10 includes underlying patterns (in particular, the wiring structure 125) disposed under the magnetic tunnel junction patterns MTJP (or the magnetic tunnel junction layer MTJL), the magnetic property measuring system 1000 may obtain signals sufficient to obtain the reliable magnetic hysteresis curves of the magnetic tunnel junction patterns MTJP (or the magnetic tunnel junction layer MTJL) of the sample 10. Thus, it is possible to provide or realize the polar MOKE measuring system with the improved signal-to-noise (S/N) ratio. In addition, even though the sample 10 includes the underlying patterns (in particular, the wiring structure 125), the reliable magnetic hysteresis curves of the magnetic tunnel junction patterns MTJP (or the magnetic tunnel junction layer MTJL) may be easily obtained, and thus it may be easy to measure the perpendicular magnetic properties of the magnetic tunnel junction patterns MTJP (or the magnetic tunnel junction layer MTJL).

Furthermore, the perpendicular magnetic properties of the magnetic tunnel junction patterns MTJP may be easily monitored using the magnetic property measuring system 1000 during the processes of manufacturing the magnetic memory device. Thus, it is possible to provide the method for manufacturing the magnetic memory device, which can improve mass production and quality stability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic property measuring system, comprising:
   a plurality of coil structures configured to apply a magnetic field to a sample, the sample including a substrate, a wiring structure on the substrate, and a plurality apart from each other, the magnetic field perpendicular to a surface of the sample, each coil structure of the plurality of coil structures including
   a pole piece, and
   a coil surrounding an outer circumferential surface of the pole piece;
   a light source configured to irradiate incident light to the sample, wherein the incident light has a wavelength equal to or less than about 580 nm; and
   a detector configured to detect a polarization of light reflected from the sample based on the incident light irradiated to the sample,
   wherein the magnetic property measuring system is configured to determine one or more perpendicular magnetic properties of the plurality of magnetic tunnel junction patterns based on analyzing the detected polarization of the reflected light.

2. The magnetic property measuring system of claim 1, wherein the incident light is visible light having a wavelength that ranges from about 400 nm to about 500 nm.

3. The magnetic property measuring system of claim 1, wherein the incident light is a continuous-wave laser light.

4. The magnetic property measuring system of claim 1, wherein the incident light has a wavelength that ranges from about 320 nm to about 580 nm.

5. The magnetic property measuring system of claim 1, wherein the plurality of coil structures, the light source and the detector at least partially comprise a polar magneto-optical Kerr effect (polar MOKE) measuring system.

6. The magnetic property measuring system of claim 5, wherein the light source is a single light source of the polar MOKE measuring system.

\* \* \* \* \*